US011329210B2

(12) United States Patent
Yanagisawa et al.

(10) Patent No.: US 11,329,210 B2
(45) Date of Patent: May 10, 2022

(54) SENSING DEVICE

(71) Applicant: NIHON DEMPA KOGYO CO., LTD., Tokyo (JP)

(72) Inventors: Yuki Yanagisawa, Saitama (JP); Hiroyuki Kukita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 79 days.

(21) Appl. No.: 16/982,031

(22) PCT Filed: Mar. 25, 2019

(86) PCT No.: PCT/JP2019/012525
§ 371 (c)(1),
(2) Date: Sep. 17, 2020

(87) PCT Pub. No.: WO2019/188992
PCT Pub. Date: Oct. 3, 2019

(65) Prior Publication Data
US 2021/0104655 A1 Apr. 8, 2021

(30) Foreign Application Priority Data
Mar. 28, 2018 (JP) .............................. JP2018-062542

(51) Int. Cl.
*H01L 35/32* (2006.01)
*H02N 2/18* (2006.01)
(Continued)

(52) U.S. Cl.
CPC ............. *H01L 35/32* (2013.01); *H02N 2/188* (2013.01); *H03B 5/32* (2013.01); *G01N 29/022* (2013.01)

(58) Field of Classification Search
CPC .......... H01L 35/32; H02N 2/188; H03B 5/32; G01N 29/022; G01N 2291/0255;
(Continued)

(56) References Cited

U.S. PATENT DOCUMENTS 6,196,059 B1 *  3/2001  Kosslinger ............ B06B 1/0692
                                                    310/322
9,086,338 B2 *  7/2015  Shinobu .................... G01N 5/02
(Continued)

FOREIGN PATENT DOCUMENTS

CN     110514976 A  * 11/2019
JP     S6453130        3/1989
(Continued)

OTHER PUBLICATIONS

"International Search Report (Form PCT/ISA/210)" of PCT/JP2019/012525, dated Jun. 18, 2019, with English translation thereof, pp. 1-4.
(Continued)

*Primary Examiner* — Francis C Gray
(74) *Attorney, Agent, or Firm* — JCIPRNET

(57) ABSTRACT

A sensing device is provided. The sensing device includes a heat regulation mechanism to regulate a temperature of a piezoelectric resonator corresponding to a voltage, and uses a sensing sensor to cause a sensing object to adsorb to and desorb from the piezoelectric resonator by increase and decrease of the temperature. A drive voltage is regulated to regulate an amplification factor of a heat regulation voltage input to a drive voltage regulator that regulates the temperature of the heat regulation mechanism corresponding to the type of a sensing sensor connected to a device main body. Therefore, when a CQCM sensor that heats a crystal resonator using a heater circuit and a TQCM sensor that regulates a heat of the crystal resonator sing a Peltier element are
(Continued)

each used, regulation ranges of the driving powers supplied to the respective heater circuit and Peltier element can be changed.

4 Claims, 6 Drawing Sheets

(51) Int. Cl.
  *H03B 5/32* (2006.01)
  *G01N 29/02* (2006.01)
(58) Field of Classification Search
  CPC ... G01N 2291/0256; G01N 2291/0426; G01N 29/326; G01N 15/0637
  See application file for complete search history.

(56) References Cited

U.S. PATENT DOCUMENTS

| | | | |
|---|---|---|---|
| 2014/0292423 A1 | 10/2014 | Isohata et al. | |
| 2017/0170832 A1* | 6/2017 | Isozaki | H03M 7/30 |
| 2017/0250691 A1 | 8/2017 | Arai | |
| 2019/0265177 A1* | 8/2019 | Kukita | G01N 25/08 |
| 2020/0274493 A1* | 8/2020 | Yanagisawa | G01N 29/222 |
| 2020/0378924 A1* | 12/2020 | Kukita | G01N 29/32 |

FOREIGN PATENT DOCUMENTS

| | | |
|---|---|---|
| JP | H05264429 | 10/1993 |
| JP | 2004245785 | 9/2004 |
| JP | 2004294356 | 10/2004 |
| JP | 2006317234 | 11/2006 |
| JP | 2011203007 | 10/2011 |
| JP | 2012220454 | 11/2012 |
| JP | 2013040892 | 2/2013 |
| JP | 2016186442 | 10/2016 |
| JP | 2018080947 | 5/2018 |

OTHER PUBLICATIONS

"Search Report of Europe Counterpart Application", dated Nov. 3, 2021, p. 1-p. 9.

* cited by examiner

SENSING DEVICE

CROSS-REFERENCE TO RELATED APPLICATION

This application is a 371 application of the international PCT application serial no. PCT/JP2019/012525, filed on Mar. 25, 2019, which claims the priority benefits of Japan application no. 2018-062542, filed on Mar. 28, 2018. The entirety of each of the abovementioned patent applications is hereby incorporated by reference herein and made a part of this specification.

TECHNICAL FIELD

The present invention relates to a sensing device that senses a sensing object from a frequency change of a piezoelectric resonator.

BACKGROUND ART

For example, as a sensing device using a sensing sensor configured to sense a material contained in a gas, there has been known a Quartz crystal microbalance (QCM) in which a crystal resonator is used, a sensor unit of the crystal resonator is cooled to cause a gas as a sensing object to adsorb to the crystal resonator, and an amount and the like of the gas is measured based on the adsorption amount. The sensing device gradually increases the temperature of the crystal resonator to evaporate the gas after the adsorption of the gas, thus identifying the gas by the evaporation temperature and performing a measurement by a frequency change of the crystal resonator before and after the gas evaporation.

As the QCM, a cooling temperature of the crystal resonator is different depending on the property of the gas as the object and the purpose of the measurement. Then, for example, a sensing device referred to as a Cryogenic QCM (CQCM) performs a cooling down to a cryogenic temperature of −190° C. using a liquid nitrogen to cause a gas to adsorb and evaporating the gas by heating with a heater. A sensing device referred to as a Thermoelectric QCM (TQCM) controls the temperature of the crystal resonator to from −80° C. to 125° C. using a Peltier element to perform the measurement. Some users selectively use the CQCM sensor and the TQCM sensor in some cases. However, selectively using measurement devices connected to the QCM sensors for each of the two types of the QCM sensor causes decrease in operation efficiency and the like, and for this reason, it is desired to use a measurement device in common.

Incidentally, in the CQCM, a drive voltage for heating the heater is controlled to, for example, 0 to 18 V by a variable regulator and the like. Meanwhile, the Peltier element used for the TQCM has a direct current of about 10 V as a withstand voltage, which is low. Therefore, when the measurement device is used in common, setting the drive voltage to the voltage of the Peltier element causes the shortage of the output of the heater, and setting the drive voltage to the heater causes a concern about a failure of the Peltier element.

While Patent Documents 1 and 2 disclose techniques to regulate a temperature of a heater in a QCM sensor, Patent Documents 1 and 2 do not disclose techniques in which a supply unit of a drive voltage for heat regulation of a heat regulation mechanism is shared by a plurality of heat regulation mechanisms having different proper voltages.

CITATION LIST

Patent Document

Patent Document 1: Japanese Unexamined Patent Application Publication No. 2004-245785
Patent Document 2: Japanese Unexamined Patent Application Publication No. H05-264429

SUMMARY OF THE INVENTION

Problems to be Solved by the Invention

The present invention has been made under these circumstances, and it is an object of the present invention to provide a technique for standardizing a voltage regulator configured to regulate a voltage for regulating a temperature irrespective of types of heat regulation mechanisms, in a sensing device that uses the sensing sensor that causes a sensing object to adsorb to and desorb from a piezoelectric resonator by increase and decrease of the temperature.

Solutions to the Problems

A sensing device of the present invention includes a piezoelectric resonator, a heat regulation mechanism, and a temperature detector. The heat regulation mechanism regulates a temperature of the piezoelectric resonator in accordance with an input drive voltage. The temperature detector detects the temperature of the piezoelectric resonator. The sensing device causes a substance to be sensed to adsorb to the piezoelectric resonator, changes the temperature of the piezoelectric resonator to sublimate the substance to be sensed, and senses the substance to be sensed based on a relationship between a change of an oscillation frequency of the piezoelectric resonator and the temperature using a sensing sensor. The sensing sensor is configured to be attachable to and detachable from a main unit. The substance to be sensed is a gas. The sensing device includes a voltage regulator and a variable voltage range change unit. The voltage regulator is disposed to the main unit. The voltage regulator includes a variable regulator that regulates a drive voltage corresponding to a heat regulation voltage. The drive voltage is output to the heat regulation mechanism. The heat regulation voltage is input based on the temperature detected by the temperature detector. The voltage regulator is disposed in common among a plurality of types of the sensing sensors that include the different heat regulation mechanisms. The variable voltage range change unit is disposed to the main unit. The variable voltage range change unit detects the type of the heat regulation mechanism disposed to the sensing sensor. The variable voltage range change unit regulates a variable range of the drive voltage output from the voltage regulator in accordance with the detected type information of the heat regulation mechanism.

Effects of the Invention

In the present invention, in the sensing device that causes a substance to be sensed, which is a gas, to adsorb to the piezoelectric resonator, changes the temperature of the piezoelectric resonator to sublimate the substance to be sensed, and senses the substance to be sensed based on a relationship between a change of an oscillation frequency of the piezoelectric resonator and the temperature, a sensing sensor that includes a piezoelectric resonator, a heat regulation mechanism that regulates a temperature of the piezoelectric resonator in accordance with an input drive voltage, and a temperature detector that detects the temperature of the piezoelectric resonator is configured to be attachable to and detachable from a main unit. A voltage regulator that includes a variable regulator is provided with the main unit. The variable regulator regulates a drive voltage output to the heat regulation mechanism corresponding to a heat regulation voltage. Furthermore, a variable voltage range change unit is provided to detect the type of the heat regulation mechanism provided with the sensing sensor, and regulates a variable range of the drive voltage output from the voltage regulator in accordance with the detected type information of the heat regulation mechanism. Accordingly, since a voltage in an appropriate range can be applied to the heat regulation mechanism corresponding to the heat regulation mechanism of the sensing sensor, the main unit can be standardized among a plurality of types of the sensing sensors that include the different heat regulation mechanisms.

DESCRIPTION OF EMBODIMENTS

Figure 1:
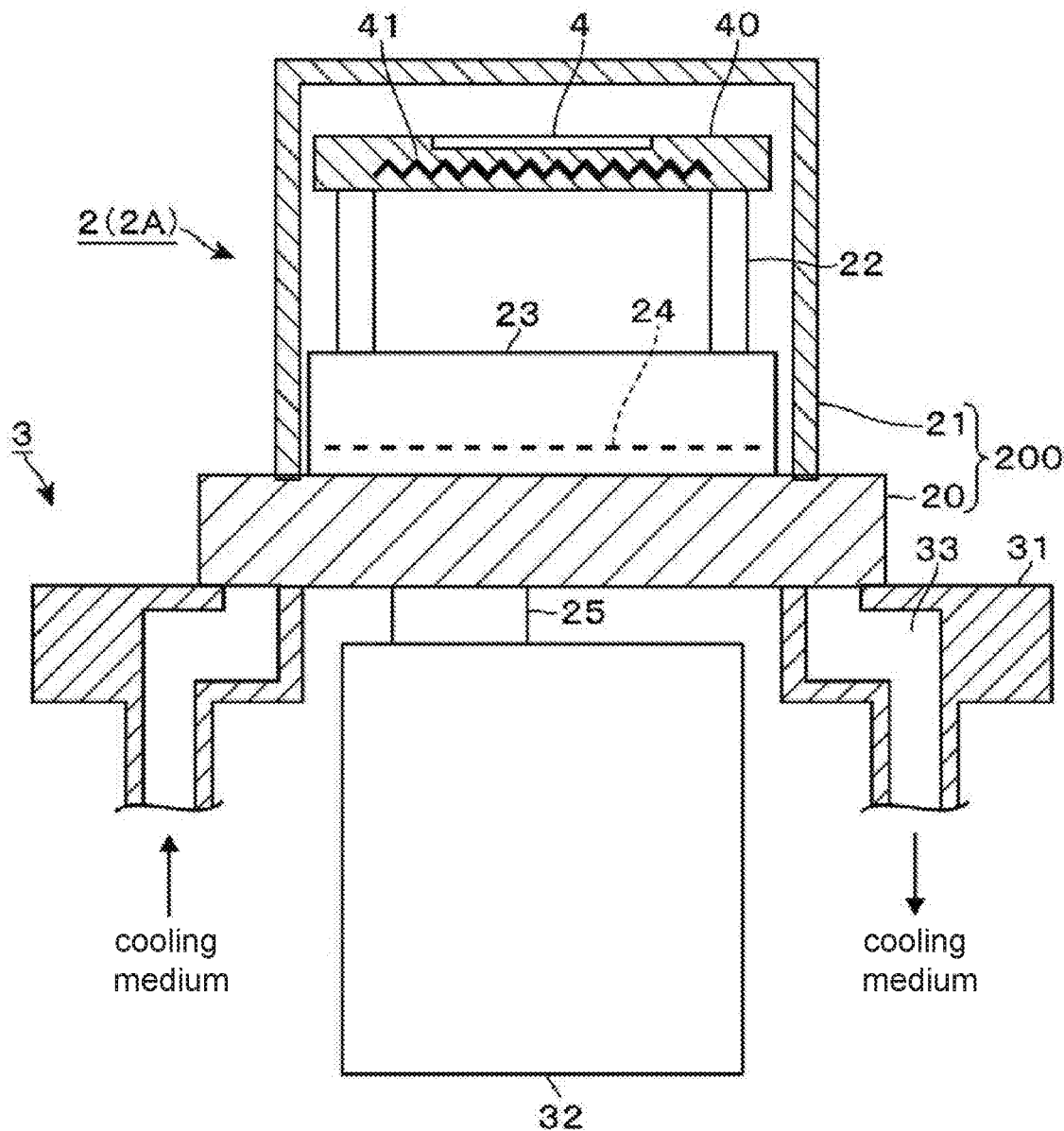
FIG. 1 is an overall configuration diagram of a sensing device according to an embodiment of the present invention.

The overall configuration of a sensing device of the present invention will be described. As illustrated in FIG. 1, the sensing device includes a device main body 3 and a sensing sensor 2 configured to be attachable to and detachable from the device main body 3. As the sensing sensor 2, for example, a CQCM sensor that cools a crystal resonator to a cryogenic temperature, for example, cools to a temperature about −190° C. to cause a gas to adsorb, and a TQCM sensor that cools a crystal resonator to a temperature about −80° C. to cause the gas to adsorb are used. FIG. 1 illustrates an example in which a CQCM sensor 2A is connected. Hereinafter, a reference numeral 2A is attached to the CQCM sensor and a reference numeral 2B is attached to the TQCM sensor.

The configuration of the sensing sensor 2 will be described. First, the CQCM sensor 2A will be described with reference to also FIG. 2. The CQCM sensor 2A includes a container 200 that includes a cylindrical lid body 21 and a base 20. The lid body 21 has an open lower side. The base 20 covers the lower side of the lid body 21. On an upper surface of the base 20 inside the container 200, a pedestal portion 23 is disposed, and a sensor substrate 40 that includes a crystal resonator 4 is disposed above the pedestal portion 23 via support pillars 22.

Figure 2:
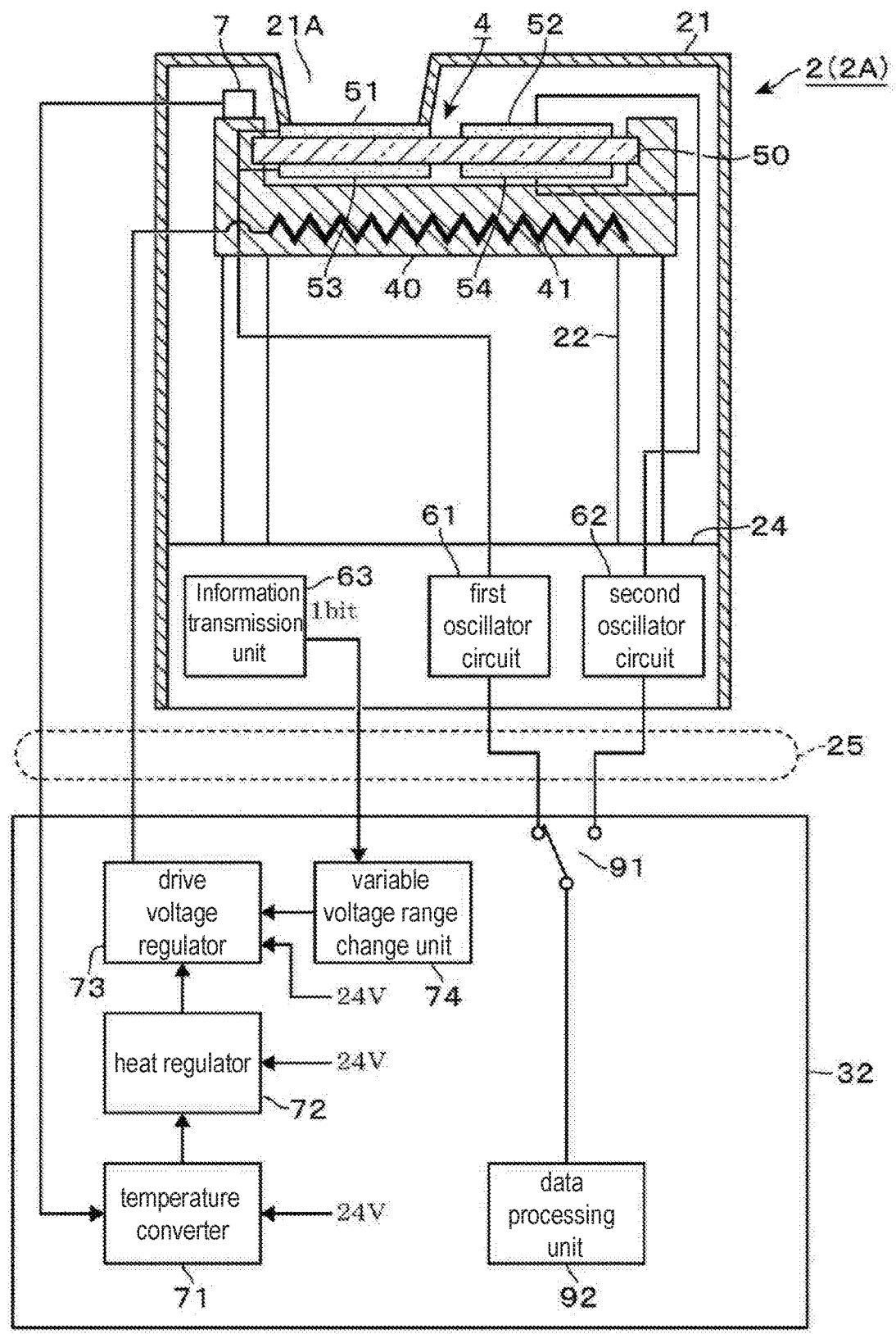
FIG. 2 is a side view of a longitudinal sectional surface illustrating a CQCM sensor.

As illustrated in FIG. 2, the sensor substrate 40 is configured to hold the crystal resonator 4 in a doubly supported posture. The crystal resonator 4 includes a crystal element 50 that is, for example, an AT-cut piezoelectric piece. On an upper surface side and a lower surface side of the crystal element 50, a pair of first excitation electrodes (reaction electrodes) 51, 53 and a pair of second excitation electrodes (reference electrodes) 52, 54, which are each formed of gold (Au) and the like, are disposed to be mutually separated.

At a position opposing the reaction electrode 51 of the upper surface side on a top panel surface of the lid body 21, a supply port 21A for supplying a gas as a sensing object to the reaction electrode 51 is provided, and the reaction electrode 51 is disposed to be exposed on the bottom portion of the supply port 21A. Therefore, the gas supplied from upward toward the CQCM sensor 2A is supplied to only the reaction electrode 51 without being supplied to the reference electrode 52.

The sensor substrate 40 internally includes a heater circuit 41 that includes, for example, a heating resistor for heating the crystal resonator 4. The heater circuit 41 is configured to regulate an electric potential difference between a positive terminal H+ and a negative terminal H− a range, for example, from 0 to 18 V, thereby regulating a temperature of the crystal resonator 4. In this example, as described later, for example, the crystal resonator 4 can be cooled to −190° C. by flowing a liquid nitrogen through a refrigerant supply passage 33, and the temperature can be increased to +125° C. by a heat generation temperature of the heater circuit 41. The sensor substrate 40 includes a temperature detector 7 formed of a thermocouple for detecting the temperature of the crystal resonator 4, and the temperature detector 7 is configured to have a resistance value that changes depending on the temperature, thus obtaining the temperature change as a voltage change.

The pedestal portion 23 internally includes an oscillator circuit board 24, and the oscillator circuit board 24 includes a first oscillator circuit 61 and a second oscillator circuit 62 connected to the reaction electrode 51, 53 and the reference electrode 52, 54 of the crystal resonator 4 of the sensor substrate 40, respectively. The oscillator circuit board 24 includes an information transmission unit 63 that transmits type information of a heat regulation mechanism of the sensing sensor 2 as, for example, a one-bit signal to a main unit 32 described below.

On the lower surface of the base 20 of the CQCM sensor 2A, as illustrated in FIG. 1, a connector 25 is disposed. The CQCM sensor 2A is configured such that the first oscillator circuit 61, the second oscillator circuit 62 and the information transmission unit 63 disposed to the oscillator circuit board 24 and the heater circuit 41 and the temperature detector 7 disposed to the sensor substrate 40 can be connected to the device main body 3 outside the CQCM sensor 2A via the connector 25.

Figure 3:
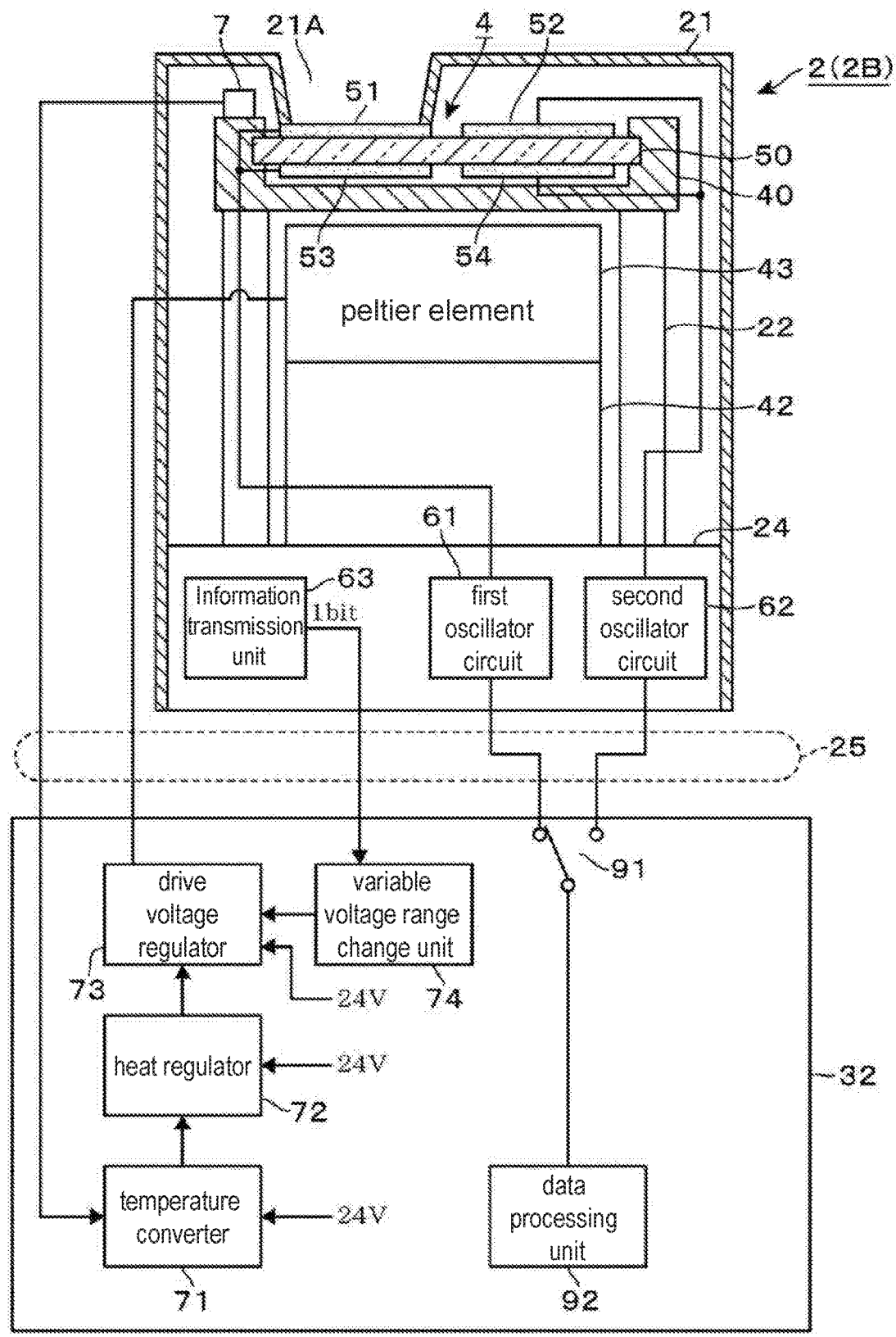
FIG. 3 is a side view of a longitudinal sectional surface illustrating a TQCM sensor.

Subsequently, the TQCM sensor 2B will be described with reference to FIG. 3. The TQCM sensor 2B is configured approximately similarly to the CQCM sensor excluding that the heater circuit 41 is not embedded in the sensor substrate 40 but a Peltier element 43 is disposed as a heat regulation mechanism below the sensor substrate 40. 42 in FIG. 3 denotes a spacer. The TQCM sensor 2B regulates a voltage of the Peltier element 43 to, for example, a range from −10 to +10 V in an electric potential difference between the positive terminal H+ side and the negative terminal H− side in a state where a coolant containing, for example, water and an antifreeze is flown through the refrigerant supply passage 33 to perform cooling. Thus, the temperature of the crystal resonator 4 can be regulated to from −80° C. to +125° C.

Subsequently, the device main body 3 provided in common between the CQCM sensor 2A and the TQCM sensor 2B described above will be described. As illustrated in FIG. 1, the device main body 3 includes a cooling base 31 that cools the base 20 and cools the entire CQCM sensor 2A. The cooling base 31 internally includes the refrigerant supply passage 33, and the sensing sensor 2 is configured to be cooled by connecting the sensing sensor 2 to the device main body 3 and supplying the cooling medium to the refrigerant supply passage 33. In the case of the CQCM sensor 2A, the entire CQCM sensor 2A is cooled by supplying the liquid nitrogen to the refrigerant supply passage 33, and the crystal resonator 4 can be cooled to, for example, −190° C. When the TQCM sensor 2B is connected to the device main body 3, a coolant containing water and an antifreeze is flown as the cooling medium through the refrigerant supply passage 33. This ensures cooling the entire TQCM sensor 2B and cooling the crystal resonator 4 to, for example, −10° C.

The device main body 3 includes the main unit 32. As illustrated in FIG. 2, the main unit 32 includes a heat regulation mechanism, here, a drive voltage regulator 73 that regulates a voltage (drive voltage) input to the heater circuit 41 or the Peltier element 43 to regulate the temperature of the crystal resonator 4. The main unit 32 includes a temperature converter 71 and a heat regulator 72. The temperature converter 71 obtains a temperature information value based on the voltage detected by the temperature detector 7. The heat regulator 72 regulates the drive voltage output from the drive voltage regulator 73 in accordance with the temperature information value and outputs a heat regulation voltage to regulate the temperature of the crystal resonator 4.

The temperature converter 71 is configured to receive, for example, a 24-V voltage, and configured to supply a current to the temperature detector 7. The temperature detector 7 is configured to have the resistance value that changes depending on the temperature as described above, a current value input from the temperature detector 7 to the temperature converter 71 changes corresponding to the temperature of the crystal resonator 4, and the temperature converter 71 outputs a temperature detection voltage of 0 to 10 V to the heat regulator 72 based on the changed current value. The heat regulator 72 receives, for example, a 24-V voltage, and outputs the heat regulation voltage to regulate the drive voltage of the heat regulation mechanism output from a variable regulator 81 described below. The heat regulation voltage is regulated using a difference value between the temperature detection voltage input from the temperature converter 71 and a voltage corresponding to a target temperature of the heat regulation mechanism. The main unit 32 includes a variable voltage range change unit 74 that regulates a variable range of the drive voltage output from the drive voltage regulator 73 based on a type signal of the sensing sensor 2 output from the information transmission unit 63 disposed to the oscillator circuit board 24.

Figure 4:
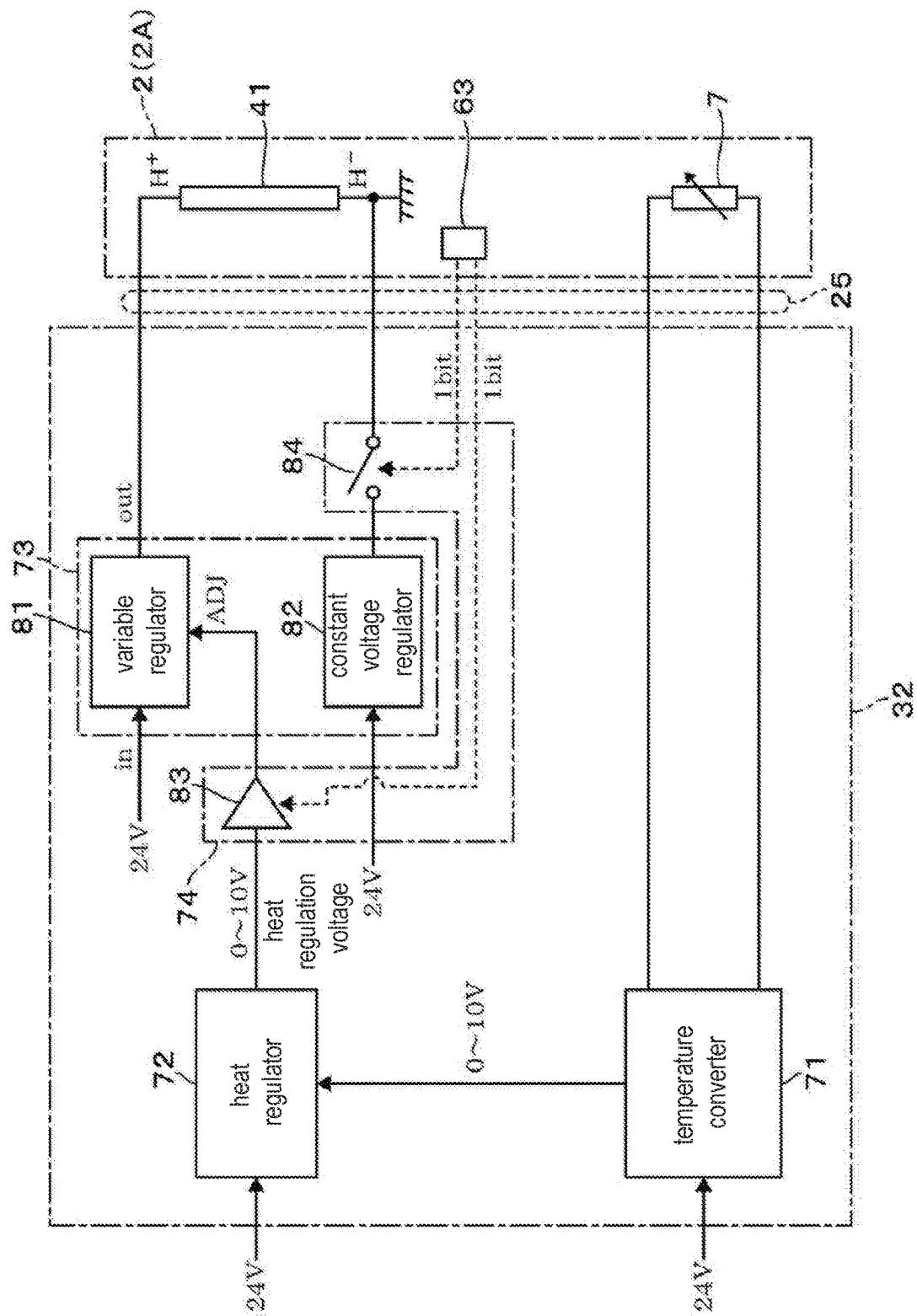
FIG. 4 is an overall configuration diagram of the sensing device.

The drive voltage regulator 73 and the variable voltage range change unit 74 will be described with reference to also FIG. 4. FIG. 4 illustrates an example in which the CQCM sensor 2A is connected to the device main body 3. The drive voltage regulator 73 includes a constant voltage regulator 82 that applies a constant voltage to the heat regulation mechanism, and the variable regulator 81 that varies the voltage input to the heat regulation mechanism (in FIG. 4, heater circuit 41). The constant voltage regulator 82 is configured to apply a 10-V constant voltage to the negative terminal H− side of the heat regulation mechanism in accordance with, for example, the input 24-V voltage. The variable regulator 81 is configured to regulate the voltage applied to the positive terminal H+ side of the heat regulation mechanism to, for example, from 0 to 20 V relative to, for example, the input 24-V voltage based on the heat regulation voltage input from an ADJ terminal.

The variable voltage range change unit 74 includes a switching unit 84 that switches on and off of the constant voltage regulator 82 to switch on and off of the input of the 10-V constant voltage to the negative terminal H− of the heat regulation mechanism. The variable voltage range change unit 74 includes an amplifier circuit 83 that changes an amplification factor of the heat regulation voltage input to the ADJ terminal of the variable regulator 81.

Figure 5:
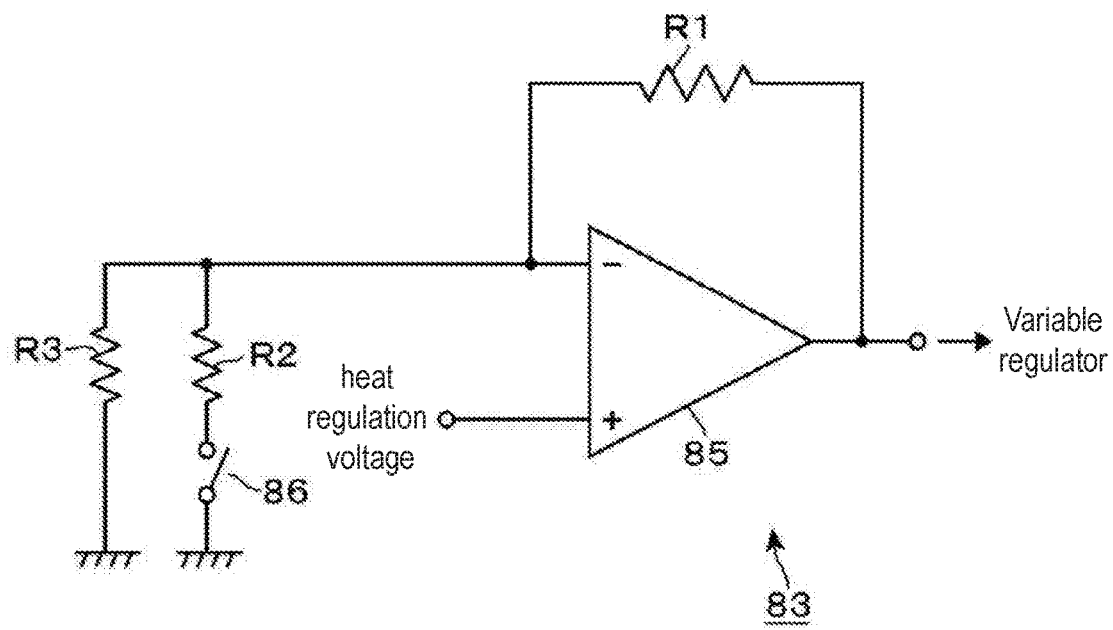
FIG. 5 is a configuration diagram illustrating an amplifier circuit.

The amplifier circuit 83 is configured as a non-inverting amplifier circuit using an operational amplifier 85, for example, as illustrated in FIG. 5, and configured to perform a feed-back from an output side to a negative input side of the operational amplifier 85 via a resistor R1. On the negative input side of the operational amplifier 85, resistors R2, R3 are disposed in mutually parallel, and on and off of a connection on the resistor R2 side is switched by a switch 86.

When a combined resistance of the resistors R2 and R3 is defined as $R_s$, and a resistance value of the resistor R1 is defined as $R_f$, an amplification factor $A_v$ of the amplifier circuit is represented by a formula (1) below.

$$\text{Amplification Factor } A_v = 1 + (R_f/R_s) \quad \text{Formula (1)}$$

Therefore, by turning the switch 86 off, Rs increases compared with the case where the switch 86 is on, thereby decreasing the amplification factor of the amplifier circuit 83. Accordingly, the heat regulation voltage is amplified relatively slightly compared with the case where the switch 86 is on, and input to the drive voltage regulator 73. Thus, the regulation range of the drive voltage output from the drive voltage regulator 73 is regulated to, for example, from 0 to 18 V.

When the switch 86 is turned on, Rs decreases compared with the case where the switch 86 is off, thereby increasing the amplification factor of the amplifier circuit 83. Accordingly, the heat regulation voltage is amplified relatively largely, and input to the drive voltage regulator 73. Thus, the regulation range of the drive voltage output from the drive voltage regulator 73 is regulated to from 0 to 20 V.

The on and off of the switch 86 of the amplifier circuit 83 and the on and off of the switching unit 84 are switched by a one-bit signal that is transmitted from the information transmission unit 63 and indicates the type information of the heat regulation mechanism. The one-bit signal, for example, a signal that indicates the type information of the CQCM sensor 2A, switches the switch 86 of the amplifier circuit 83 "off" and switches the switching unit 84 "off." In the case of a signal that indicates the type information of the TQCM sensor 2B, the switch 86 of the amplifier circuit 83 is switched to "on" and the switching unit 84 is switched to "on."

Return to FIG. 2, the main unit 32 includes a data processing unit 92, and the outputs of the first and the second oscillator circuits 61, 62 described above are input to the data processing unit 92 via a switch 91. The data processing unit 92 obtains a frequency of a frequency signal as an input signal, and performs digital processing of the obtained frequency information. Thus, the data processing unit 92 obtains time-series data of a first oscillation frequency "F1"

output from the first oscillator circuit 61 and time-series data of a second oscillation frequency "F2" output from the second oscillator circuit 62.

In the sensing device of the present invention, the switch 91 is used to perform an intermittent oscillation in which a channel 1 that connects the first oscillator circuit 61 to the data processing unit 92 and a channel 2 that connects the second oscillator circuit 62 to the data processing unit 92 are alternately switched. This avoids an interference between the reaction electrodes 51, 53 and the reference electrodes 52, 54 of the sensing sensor 2 to ensure obtaining the stable frequency signal. Then, the frequency signal is, for example, time-divided and retrieved by the data processing unit 92. In the data processing unit 92, the frequency signal is calculated as, for example, a digital value, and arithmetic processing is performed based on time division data of the calculated digital value.

Figure 6:
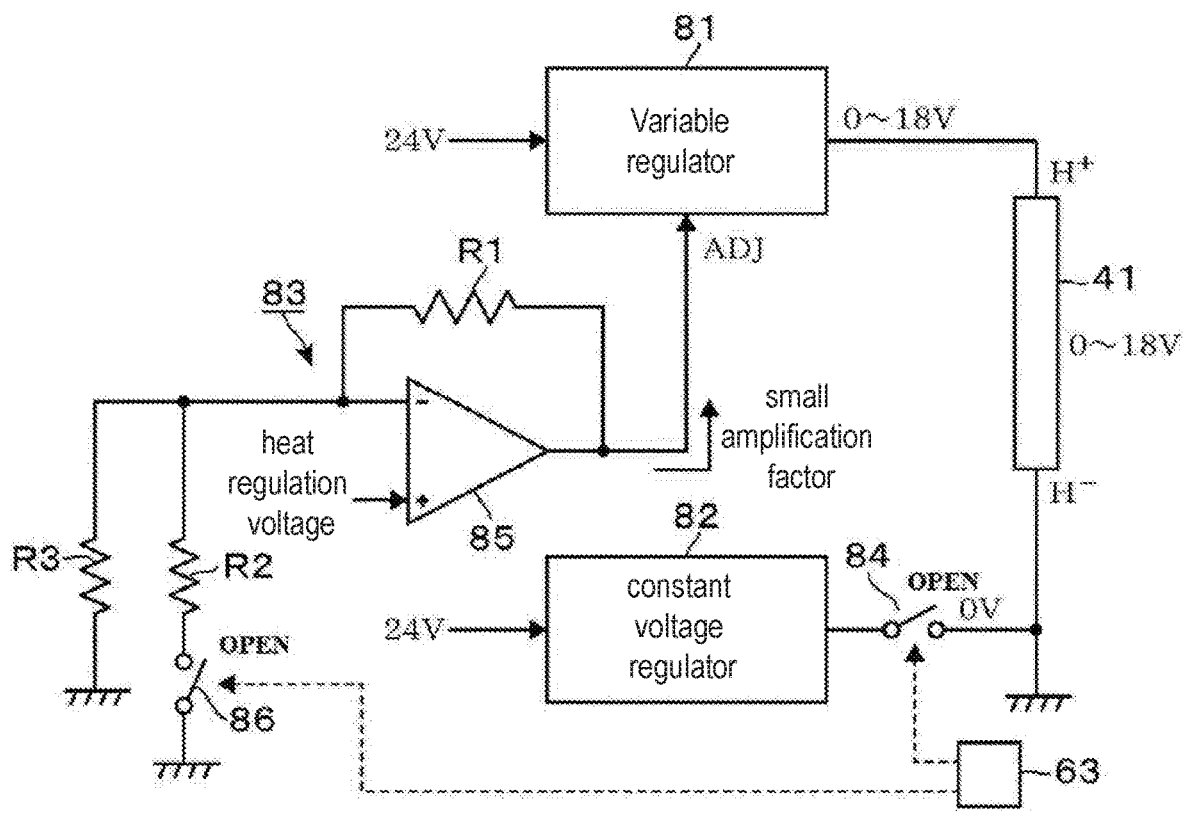
FIG. 6 is a configuration diagram illustrating the sensing device when the CQCM sensor is connected.

Subsequently, operations of the sensing device according to the embodiment of the present invention will be described. For example, assume that the CQCM sensor 2A illustrated in FIG. 2 is used as the sensing sensor 2. When the CQCM sensor 2A is mounted to the device main body 3, the CQCM sensor 2A is connected to the main unit 32 via the connector 25. At this time, as illustrated in FIG. 6, an output of the variable regulator 81 of the main unit 32 side is connected to the positive terminal H+ side of the heater circuit 41, and the constant voltage regulator 82 is connected to the negative terminal H− side of the heater circuit 41 via the switching unit 84. At this time, while not being illustrated in FIG. 6, the temperature detector 7 is connected to the temperature converter 71.

For example, a one-bit signal informing that the CQCM sensor 2A is connected is input to the main unit 32 side from the information transmission unit 63 provided to the oscillator circuit board 24. Then, the signal input to the main unit 32 is input to the variable voltage range change unit 74, and the switching unit 84 is switched to turn the connection between the constant voltage regulator 82 and the heater circuit 41 off. Accordingly, the input of the 10-V voltage from the constant voltage regulator 82 to the negative side terminal of the heater circuit 41 is cut off. The one-bit signal switches the switch 86 of the amplifier circuit 83 off. This switching decreases the amplification factor of the amplifier circuit 83. Therefore, a heat regulation voltage output from the heat regulator 72 is amplified by the amplifier circuit 83 with the small amplification factor, and input to the ADJ terminal of the variable regulator 81. Therefore, the variable regulator 81 outputs, for example, a voltage of 0 to 18 V based on the heat regulation voltage. At this time, since the connection between the constant voltage regulator 82 and the heater circuit 41 is cut off, the drive voltage, which is supplied based on the heat regulation voltage and regulated to the range from 0 to 18 V, is applied to the heater circuit 41, and the heat generation temperature is regulated.

When the CQCM sensor 2A is used for the measurement, a liquid nitrogen as a cooling medium is flown through the base 20 to cool the crystal resonator 4, and a driving power of the heater circuit 41 is regulated in the range from 0 to 18 V. Thus, the temperature of the crystal resonator 4 is regulated in a range, for example, from −190° C. to 125° C., and measuring the sensing object is performed.

For example, when a gas as the sensing object is supplied toward the supply port 21A of the CQCM sensor 2A in a state where the CQCM sensor 2A is cooled to −190° C. by the liquid nitrogen, the gas as the sensing object is cooled by contacting the reaction electrode 51 exposed on the bottom portion of the supply port 21A, and adsorbs to the reaction electrode 51.

Next, the switch 91 is switched by time division, and the temperature of the heater circuit 41 is gradually increased at, for example, 1° C./1 minute while measuring the first oscillation frequency F1 and the second oscillation frequency F2 by the data processing unit 92. At this time, the temperature detector 7 always detects the temperature, and the heating is performed while controlling an amount of the electric power supply supplied from the drive voltage regulator 73 to the heater circuit 41 based on the detected value.

Gradually heating the crystal resonator 4 sublimates the sensing object adsorbed to the reaction electrode 51, and the oscillation frequency F1 of the reaction electrode 51 significantly varies when desorbing from the reaction electrode 51. Therefore, the data processing unit 92 obtains this timing through an observation of the oscillation frequencies F1, F2, and detects the mass of the sensing object based on the difference between the first oscillation frequency F1 and the second oscillation frequency F2. While the temperature detector 7 always detects the temperature, the temperature at the timing is detected as a sublimation temperature of the sensing object. Based on thus detected sublimation temperature, the type of the sensing object can be identified.

Figure 7:
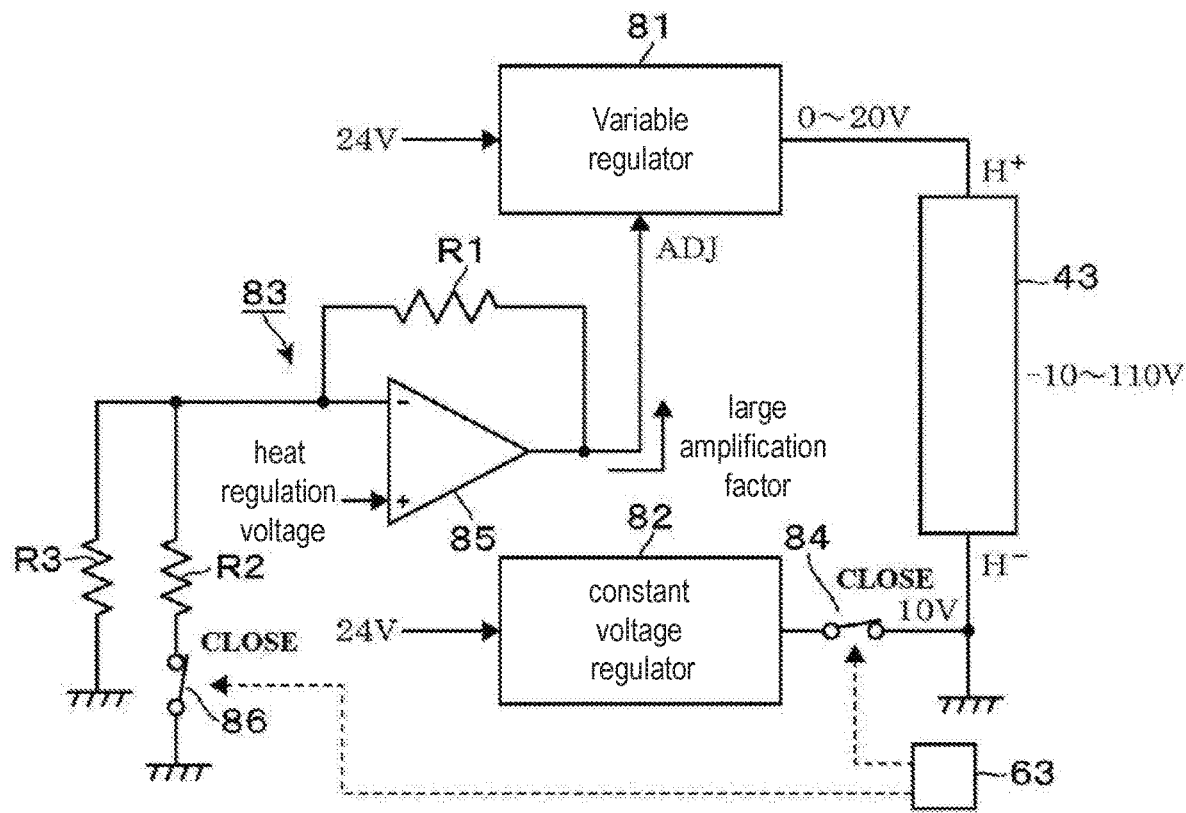
FIG. 7 is a configuration diagram illustrating the sensing device when the TQCM sensor is connected.

Subsequently, a description will be given of a case where the TQCM sensor 2B is used for measuring the gas as the sensing object. The TQCM sensor 2B is mounted to the device main body 3, and the TQCM sensor 2B is connected to the main unit 32 via the connector 25. Thus, the constant voltage regulator 82 is connected to the negative terminal H− side of the Peltier element 43 via the switching unit 84, and the variable regulator 81 is connected to positive terminal H+ side of the Peltier element 43 as illustrated in FIG. 7. While not being illustrated in FIG. 7, the temperature detector 7 is connected to the temperature converter 71.

Furthermore, for example, a one-bit signal informing that the TQCM sensor 2B is connected is input to the main unit 32 from the information transmission unit 63 disposed to the oscillator circuit board 24. Then, the one-bit signal input to the main unit 32 switches the switching unit 84 connected to the constant voltage regulator 82 on. Accordingly, a constant voltage of 10 V is input from the constant voltage regulator 82 to the negative terminal H− side of the Peltier element 43. The one-bit signal input to the main unit 32 switches the switch 86 of the amplifier circuit 83 on. Accordingly, the amplification factor of the amplifier circuit 83 increases compared with the case where the CQCM sensor 2A is connected.

Therefore, the heat regulation voltage output from the heat regulator 72 is amplified by the amplifier circuit 83 with the large amplification factor compared with the case where the CQCM sensor 2A is connected, and input to the ADJ terminal of the variable regulator 81. Accordingly, the variable regulator 81 outputs, for example, a voltage in a range from 0 to 20 V, that is, a voltage in a wide range compared with the case where the CQCM sensor 2A is connected, based on the heat regulation voltage. As described above, when the TQCM sensor 2B is used, the 10-V constant voltage is applied from the constant voltage regulator 82 to the negative terminal H− side of the Peltier element 43. Therefore, in the Peltier element 43, the electric potential difference between the positive terminal H+ and the negative terminal H− is regulated to the range from −10 V to +10 V in combination with the range of the drive voltage output from the variable regulator 81 and the drive voltage input from the constant voltage regulator 82, thus regulating the temperature to be output.

When the TQCM sensor 2B is used for the measurement, the drive voltage of the Peltier element 43 is regulated to the range from −10 V to +10 V while cooling the base 20 to −10° C. by the cooling medium. Thus, the temperature of the crystal resonator 4 is regulated to a range, for example, from −80° C. to 125° C., and measuring the sensing object is performed.

Then, similarly to the example of the CQCM sensor 2A, a gas as the sensing object is supplied toward the supply port 21A of the TQCM sensor 2B, and the crystal resonator 4 is cooled to, for example, −80° C. by the Peltier element 43, thereby causing the gas to adsorb to the reaction electrode 51. Furthermore, the switch 91 is switched by time division, and the temperature of the Peltier element 43 is gradually increased at, for example, 1° C./1 minute while measuring the first oscillation frequency F1 and the second oscillation frequency F2 by the data processing unit 92. Then, similarly to the example of the CQCM sensor 2A, the mass of the sensing object is detected, and is detected as the sublimation temperature of the sensing object. Based on thus detected sublimation temperature, the type of the sensing object can be identified.

According to the above-described embodiment, the sensing device cools and heats the crystal resonator 4 to cause the sensing object to adsorb and desorb, thereby sensing the sensing object in accordance with the frequency change of the crystal resonator 4 before and after the desorption of the sensing object. In the sensing device, the drive voltage is regulated to regulate the amplification factor of the heat regulation voltage input to the drive voltage regulator 73 that regulates the temperature of the heat regulation mechanism depending on the type of the sensing sensor 2 connected to the device main body 3. Therefore, when the CQCM sensor 2A that heats the crystal resonator 4 using the heater circuit 41 and the TQCM sensor 2B that regulates the heat of the crystal resonator 4 using the Peltier element 43 are each used, the regulation ranges of the driving powers supplied to the respective heater circuit 41 and Peltier element 43 can be changed. Accordingly, since an appropriate drive voltage can be applied to each of the heater circuit 41 and the Peltier element 43, the device main body 3 can be standardized between the CQCM sensor 2A and the TQCM sensor 2B.

The Peltier element 43 applied to the TQCM sensor 2B has a voltage endurance value that differs depending on its working temperature. As described for the sensing device according to the embodiment of the present invention, amplifying the heat regulation voltage input to the variable regulator 81 using the amplifier circuit 83 ensures regulating the output voltage range of the variable regulator 81. Accordingly, the device main body 3 can be standardized even among a plurality of TQCM sensors 2B that include the respective Peltier elements 43 having the different voltage endurance value. Similarly, the device main body 3 can be standardized even among a plurality of CQCM sensors 2A having different operating temperature ranges of the heater circuit 41.

The present invention may have a configuration in which on and off of the constant voltage regulator 82 that supplies the constant voltage to the heat regulation mechanism is switched corresponding to the type of the heat regulation mechanism of the sensing sensor 2, thus regulating the range of the voltage supplied to the heat regulation mechanism.

Furthermore, when applying to more types of the sensing sensor 2, the output range of the drive voltage output from the drive voltage regulator 73 is preferably switched to more patterns. Therefore, for example, information output from the information transmission unit 63 may be received by a control unit that includes, for example, a CPU and a program, thus switching the output range of the drive voltage output from the drive voltage regulator 73 by the control unit.

The type information of the heat regulation mechanism of the sensing sensor 2 may be input by the device main body 3 side, and it is only necessary that the switch is switched corresponding to the input type information as described above.

The invention claimed is:

1. A sensing device, comprising:
   a piezoelectric resonator;
   a heat regulation mechanism that regulates a temperature of the piezoelectric resonator in accordance with an input drive voltage; and
   a temperature detector that detects the temperature of the piezoelectric resonator,
   wherein the sensing device causes a substance to be sensed to adsorb to the piezoelectric resonator, changes the temperature of the piezoelectric resonator to sublimate the substance to be sensed, and senses the substance to be sensed based on a relationship between a change of an oscillation frequency of the piezoelectric resonator and the temperature using a sensing sensor,
   wherein the sensing sensor is configured to be attachable to and detachable from a main unit, and the substance to be sensed is a gas,
   wherein the sensing device further comprising:
      a voltage regulator disposed to the main unit, the voltage regulator including a variable regulator that regulates a drive voltage corresponding to a heat regulation voltage, the drive voltage being output to the heat regulation mechanism, the heat regulation voltage being input based on the temperature detected by the temperature detector, the voltage regulator being disposed in common among a plurality of types of the sensing sensors that include the different heat regulation mechanisms; and
      a variable voltage range change unit disposed to the main unit, the variable voltage range change unit detecting the type of the heat regulation mechanism disposed to the sensing sensor, the variable voltage range change unit regulating a variable range of the drive voltage output from the voltage regulator in accordance with the detected type information of the heat regulation mechanism.

2. The sensing device according to claim 1, wherein the variable voltage range change unit includes an amplifier circuit that changes an amplification factor of the heat regulation voltage input to the variable regulator.

3. The sensing device according to claim 1, wherein the plurality of types of the heat regulation mechanisms include:
   a heater circuit having a heat generation temperature that changes based on a positive drive voltage, or
   a Peltier element that generates a heat or perform a cooling based on a positive drive voltage or a negative drive voltage;
   wherein the voltage regulator includes a constant voltage regulator that applies a negative voltage to the heat regulation mechanism,
   the variable voltage range change unit includes a switching unit that turns the constant voltage regulator on and off, the constant voltage regulator is turned off and the variable regulator is used to regulate the drive voltage supplied to the heater circuit, when the detected type information of the heat regulation mechanism indicates the heater circuit, and the constant voltage regulator is turned on, a negative constant voltage is applied to the Peltier element, and the variable regulator is used to regulate a positive voltage supplied to the Peltier element to regulate the drive voltage supplied to the Peltier element, when the detected type information of the heat regulation mechanism indicates the Peltier element.

4. The sensing device according to claim 1, wherein the sensing sensor includes an information transmission unit that outputs the type information of the heat regulation mechanism as a signal wave, and the variable voltage range change unit receives the signal wave output from the information transmission unit and regulates the variable range of the drive voltage corresponding to the type information of the heat regulation mechanism, when the sensing sensor is connected to the main unit.

* * * * *